United States Patent [19]

Srinivasan et al.

[11] 4,363,099

[45] Dec. 7, 1982

[54] METHOD AND SYSTEM FOR MEASURING FREQUENCY DEVIATION OF LOW FREQUENCY SIGNALS

[75] Inventors: Krishnaswamy Srinivasan; Chinh T. Nguyen, both of St. Bruno, Canada

[73] Assignee: Hydro-Quebec, Montreal, Canada

[21] Appl. No.: 129,756

[22] Filed: Mar. 13, 1980

[51] Int. Cl.³ .............................................. G01K 23/00
[52] U.S. Cl. ................................. 364/484; 324/83 D
[58] Field of Search .............. 364/484, 485, 483, 492, 364/493; 324/78 D, 79 D, 83 D

[56] References Cited

U.S. PATENT DOCUMENTS

| | | | |
|---|---|---|---|
| 3,829,785 | 8/1974 | Schroder et al. | 364/484 X |
| 4,027,146 | 5/1977 | Gilmore | 364/484 |
| 4,093,988 | 6/1978 | Scott | 364/484 |
| 4,150,432 | 4/1979 | Sorden | 364/484 |
| 4,168,526 | 9/1979 | Auer, Jr. et al. | 364/484 X |
| 4,215,308 | 7/1980 | Kusters | 324/83 D X |
| 4,217,651 | 8/1980 | Pickering | 364/483 X |
| 4,224,568 | 9/1980 | Griner | 364/484 X |

*Primary Examiner*—Edward J. Wise
*Attorney, Agent, or Firm*—Oblon, Fisher, Spivak, McClelland & Maier

[57] ABSTRACT

A method and a system for frequency measuring or monitoring and particularly suitable for power system frequencies in the range of approximately 0-2 KHz is disclosed. The technique is suitable for single-phase or three-phase periodic signals. Synchronism of sampling to power systems waveform and zero crossing detection are not required. The method is particularly attractive when used in conjunction with other on-line digital processing/control tasks since the interface between the power network and the computer may be shared and the fast and accurate detection of frequency variation can be beneficially used by the rapid digital processors.

10 Claims, 3 Drawing Figures

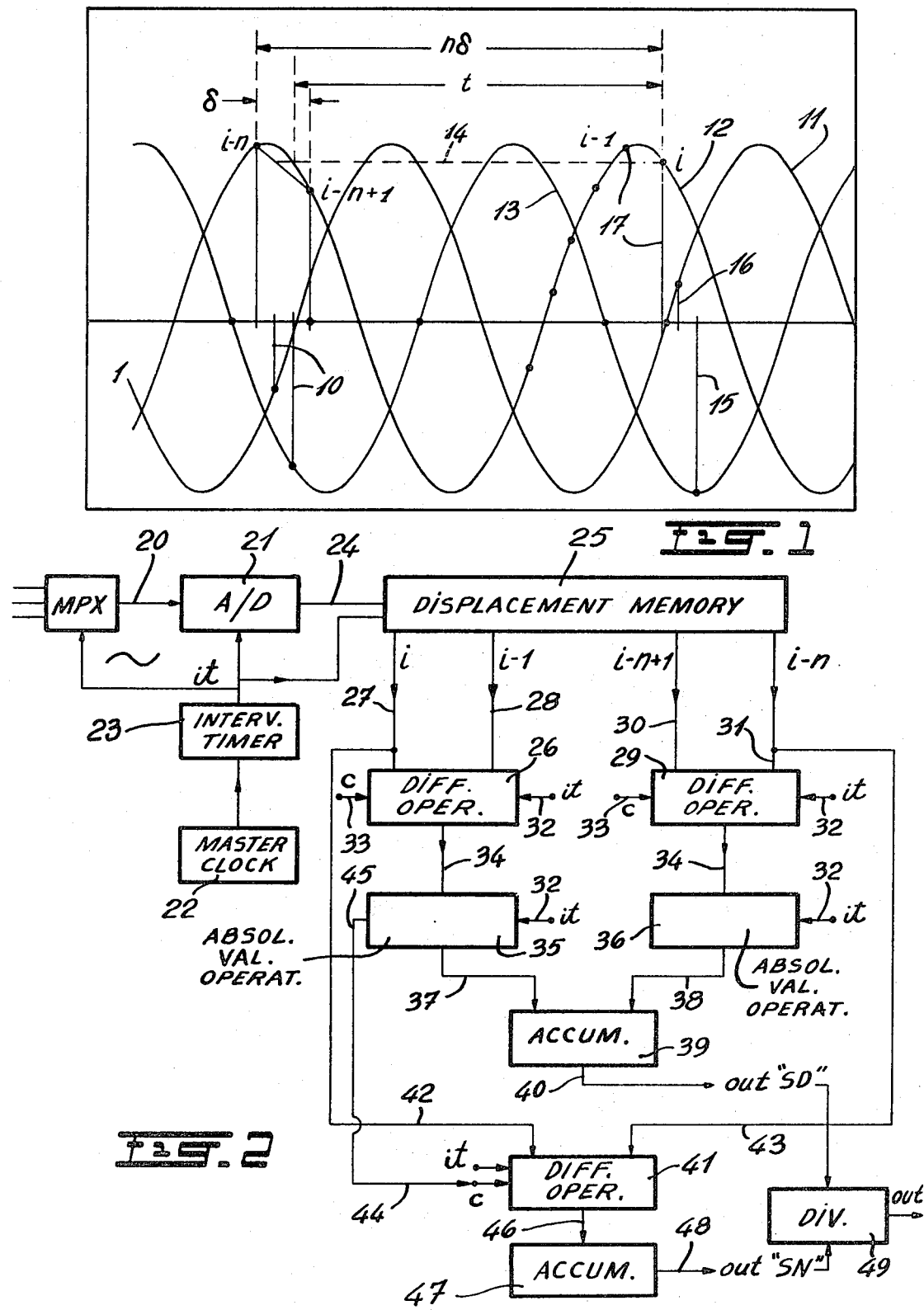

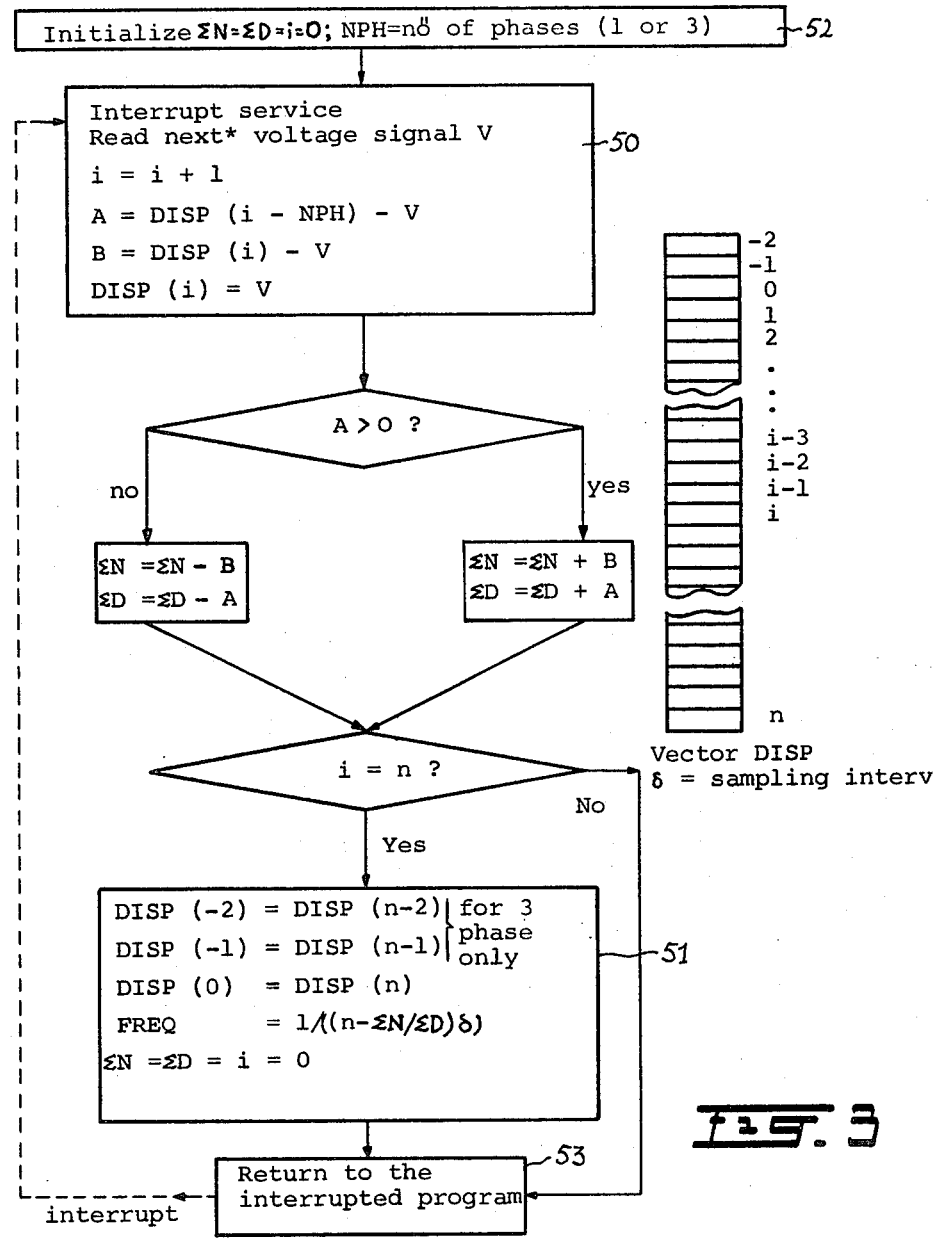
Flow Diagram for frequency computation
* In case of 3 phase the voltage signal read rotate as VA, VB, VC, VA ... etc.

METHOD AND SYSTEM FOR MEASURING FREQUENCY DEVIATION OF LOW FREQUENCY SIGNALS

BACKGROUND OF INVENTION (a) Field of the Invention

The present invention relates to a method and a system for measuring frequency or frequency deviation of a periodic signal in the range of approximately from 0 to 2 KHz and wherein the measuring is effected by sampling the periodic signal at precise time intervals and providing digital value signals representative of the sampled values for processing to calculate the lapse time of the signal since its previous crossing of the same level.

(b) Description of Prior Art

With the growth of power systems, permissible frequency deviations have been reducing while at the same time frequency-bias, (expressed as megawatts per 0.1 Hz deviation) have been increasing.

The advent of frequency sensitive relays, load behaviour modelling and other computer controlled loops have necessitated measurements of power system frequency with a degree of speed, precision and stability, not provided by conventional electromechanical instruments.

Various methods have been suggested based on measurement of the time between zero crossings of the signals. Others have suggested the calculation of the frequency on the basis of a comparison with a standard and precise periodic signal. Various types of circuitry are employed in these methods such as digital, analog and hybrid circuits.

All the methods stress the importance of an analog meter display even if some have the frequency available in numerical form. All assume signals to be reasonably free from random and high frequency noise so that a zero crossing detector (inherent in all the above methods) will perform satisfactorily. None have any estimate of frequency before half a cycle, and some have longer lags due to the use of filters.

Our studies of the voltage and current waveforms of power systems at bulk power substation level in normal operation show that the random noise present can cause the zero crossing detection, of the prior art, to be quite inaccurate, particularly in view of the small magnitude of frequency variations to be measured.

SUMMARY OF INVENTION

It is therefore a feature of the present invention to provide a method and a system for measuring small magnitude of frequency deviation of low frequency signals of about 0 to 2 KHz, and which substantially overcomes the above-mentioned disadvantages.

A further feature of the present invention is to provide a power system frequency measuring system or meter for measuring frequencies in the low frequency range of approximately 0 to 2 KHz by computing at each sampling instant, and estimating, with precision, the time period of the signal, namely the lapse time since the previous crossing of the signal at the same level (zero or non-zero) whereby to calculate the frequency deviation of the signal.

According to the above features, from a broad aspect, the present invention provides a method of measuring frequency or frequency deviation of a periodic signal in the range of approximately from 0 to 2 KHz. The method comprises the steps of sampling the periodic signal at precise time intervals to obtain sample values. The sample values are converted to provide digital value signals. A predetermined number of the digital value signals representative of the lapse time of at least a time period of the periodic signal, are stored.

The frequency, frequency deviation or time period deviation is then derived by linearly interpolating two successive samples of said digital value signals to determine the time period deviation of said periodic signal and in accordance with the formula $$N = (V_{i-n} - V_i) \, \text{Sgn}(V_{i-1} - V_i)$$

$$D = |V_{i-1} - V_i| + |V_{i-n+1} - V_{i-n}|$$

$$\tfrac{1}{2}\alpha = \Sigma N / \Sigma D$$

$$f = 1/(n-\alpha)\delta$$

where $V_i$, $V_{i-1}$, $V_{i-n}$ and $V_{i-n+1}$ are digital value signals and Sgn is the sign + or −, $\alpha$ the time period deviation and f the frequency $V_{i-1}$ and $V_{i-n+1}$ are to be replaced by $V_{i-3}$ and $V_{i-n+3}$ in case of a three-phase multiplexed signal.

According to a further broad aspect of the present invention, there is provided a power system frequency measuring system for measuring frequencies in the low frequency range of approximately 0 to 2 KHz. The system comprises an analog/digital converter circuit having an input for receiving a periodic signal whose frequency is to be measured. A real time clock controls the analog to the digital converter circuit to provide a periodic time signal for sampling the frequency signal at precise intervals. The A/D converter circuit provides output digital value signals at the precise intervals and derived from a signal at its input. Memory device is provided for storing a predetermined number of the digital value signals representative of the lapse time of above a time period of the signal. Devices to perform certain arithmetic operations are further provided for processing selected samples of the stored digital value signals to provide output numerator and denominator signal values expressed by the formula:

$$\text{Num. } N = (V_{i-n} - V_i) \, \text{Sgn}(V_{i-1} - V_i)$$

$$\text{Den. } D = |V_{i-1} - V_i| + |V_{i-n+1} - V_{i-n}|,$$

where $V_i$, $V_{i-1}$, $V_{i-n}$ and $V_{i-n+1}$ are digital value signals and Sgn is the function sign (+ or −). Divider operator provides a resultant output signal from the N and D signal values. The resultant signal is representative of the frequency deviation of the signal.

BRIEF DESCRIPTION OF DRAWINGS

A preferred embodiment of the present invention will now be described with reference to the accompanying drawings in which:

FIG. 1 is an illustration of a three-phase periodic signal showing the sampling time intervals and an example of the location of the first, second, last and second to last sampled values in such time period;

FIG. 2 is a block diagram of the power system frequency measuring system; and

FIG. 3 is a flow diagram of a program.

DESCRIPTION OF PREFERRED EMBODIMENTS

With reference to FIG. 1, there is shown the waveforms in a three-phase system, each signal being denoted by respective reference numerals 11, 12 and 13. The method and system proposed herein is based on computing at each sampling instant 10, an estimate of the time period t, namely, the lapse time since the previous crossing of the same signal at the same level as that of the sampling instant. A weighted mean time period deviation is computed from the three phases 11, 12 and 13, and the weight being the absolute value of the level variations between two successive sampling instants. The poor estimates of time periods from the samples near the peak of the waveform are automatically weighted out, and each set of three-phase samples (may or may not be concurrent) lead to time period estimates of uniform precision. The changes in frequency during as short as three sampling instants (in a three-phase system) can be detected. It should be noted that other weighting functions such as the square values are also appropriate. It is also noted that the method is as equally applicable to a single phase periodic signal.

Digital frequency determination is obtained by the system and method which will be described later and based on the following mathematical basis.

If n (for 3-phase, nearest multiple of 3) is the number of samples required to span a time period, then $$n\delta > 1/f$$

where $\delta$ is the time lapsed between two successive samples.

The time period deviation can be computed by linear interpolation between two successive sampling instants as follows:

$$\alpha = n\delta - 1/f = (V_{i-n} - V_i)/(V_{i-n} - V_{i-n+1}) \text{ or } (V_{i-n} - V_i)/(V_{i-1} - V_i)$$

As mentioned above, since the value computed when V is near a peak is very imprecise, the $\alpha$'s are weighted by their respective absolute values $$|[V_{i-n} - V_{i-n+1}]| \text{ or } |V_{i-1} - V_i|$$

and thus the following relation is obtained:

$$N = (V_{i-n} - V_i) \, \text{Sgn}(V_{i-1} - V_i)$$

$$D' = |V_{i-1} - V_i| \text{ or } |V_{i-n+1} - V_{i-n}|$$

$$D = |V_{i-1} - V_i| + |V_{i-n+1} - V_{i-n}|$$

$$\alpha = N/D' = 2N/D$$

In order to reduce the effect of changes in amplitude of the signal, and to improve the immunity to random noise, N and D are accumulated over an equal number of samples and then divided. Thus the following relation is obtained:

$$\tfrac{1}{2}\alpha = \Sigma N/\Sigma D = \Sigma N/\Sigma D.$$

Frequency may be computed from the deviation "$\alpha$" computed in the previous formula.

$$f = 1/(n - \alpha)\delta$$

In case of a 3-phase multiplexed signal, $V_{i-1}$ and $V_{i-n+1}$ are to be changed to $V_{i-3}$ and $V_{i-n+3}$ respectively. It should be noted that frequency may be calculated from the output signal of this time period deviation.

Referring now to FIG. 2, there is shown the system which realizes the computation of the present invention. A single phase or three-phase multiplexed signal is fed to the input 20 of an analog to digital converter circuit 21. A master clock 22 provides clocking pulses to an interval timer 23 which provides periodic time signals to the A/D converter for sampling the frequency signal on the input 20 at precise intervals of time, namely intervals 10 as shown in FIG. 1. The interval timer 23 controls also the timing of the multiplexing device and the displacement memory device. The converter circuit 21 provides output digital value signals at its output 24 for each sampled interval 10 of the input signal. The value of the digital signals are representative of the amplitude of the signals, from the zero level, at that precise sampling instant.

The digital value signals at the output 24 are fed to a memory device, herein a displacement memory 25, for storing a predetermined number, namely $n\delta$, of the digital value samples. The frequency of the signal being approximately known, the displacement memory is of such a size whereby there will be sufficient digital value samples to scan a complete cycle.

Operator system in the form of differential operators and absolute value operators and accumulators are provided for processing selected digital values from the displacement memory to provide output numerator and denominator signal values "SN" and "SD" expressed by the above-mentioned formulas. This computation is accomplished as follows. As shown in FIG. 2, a first differential operator 26 has two inputs 27 and 28 connected respectively to a first and a second digital value signal of the displacement memory 25. Similarly, a second differential operator 29 has two inputs 30 and 31 connected respectively to a second to last and last digital value signal from the displacement memory. As expressed by the formula, the first signal is $V_i$, the second signal is $V_{i-1}$, the second to last signal is $V_{i-n+1}$ and the last signal is $V_{i-n}$.

Each of the operators 26 and 29 has a clock input 32 from the interval timer circuit 23 whereby the system operates in synchronism. Also, the differential operators are provided with a control input 33 which determines the sign of the function of the differential operator, that is to say, subtraction with or without a change of sign operation. These are preset functions. The output 34 from each of the differential operators 26 and 29 connect respectively to an absolute value operator 35 and 36. The output of the absolute value operators consists of absolute output signals fed to the inputs 37 and 38, respectively, of an accumulator 39. At the output 40 of the accumulator 39 are the output signals "SD".

A third differential operator 41 is provided with two inputs 42 and 43 connected respectively to the first digital value signal and the last digital value signal, respectively. A third input 44 connects to an output 45 of the absolute value operator connected to the differential operator 26. At this output 45 are the sign Sgn signals of the output signals on output connection 37. Signals from the differential operator 41 are fed to an input 46 of an accumulator 47. At the output 48 of the accumulator 47 are the signals "SN". Both the signals SD and SN are fed to a division device, herein a divider circuit 49, whereby at sample times, the numerator signal is divided by the denominator signal to produce a resultant output signal at its output 50 representative of the time period deviation of the measured signal. Alternatively, and as previously mentioned, the circuit could be adapted to provide an output which is proportional to the frequency actually measured.

Additionally, as shown, a multiplex circuit "MPX" may be connected in case of a three-phase frequency signal to sequentially select each signal of the three-phase at the precise sampling instants and to feed that signal to the A/D converter 21 of FIG. 2 to provide output digital value signals from the divider 21 representative, sequentially, of the three phases. FIG. 1 shows the three sequential samples on a respective one of the three phases 11, 12 and 13.

It is obvious to a person skilled in the art that the output from the divider 49 could be used directly by other digital circuits. If, for example, a display of frequency is required in a system, a suitable calibrated digital or analog meter can use this signal as its input. It is also noted that the operator system, as described herein, can be realized using conventional, off-the-shelf, electronic circuitry. This invention is concerned with the method and the system or device for carrying out the method to determine the frequency deviation of a low frequency signal. Various system devices such as microprocessor based systems, may be used to perform the operation described herein without departing from the invention. A detailed flow diagram showing the steps of a program to carry out the operation of the system is illustrated in FIG. 3.

Broadly described, the method herein defined consists in measuring frequency or frequency deviation of a low frequency signal in the range of approximately from 0 to 2 KHz and comprising the steps of sampling the signal at precise time intervals to obtain sampled values. The sampled values are converted to digital value signals which are stored in a displacement memory and representative of at least a time period of a frequency signal. The time period deviation is then derived from selected samples of the stored digital value signals by linearly interpolating two successive ones of such stored digital value signals in accordance with the formula expressed herein.

It is within the ambit of the present invention to cover any obvious modifications of the method and system described, provided these fall within the scope of the broad claims appended hereto.

The following is a computer program listing to simulate the operation of the flow diagram of FIG. 3 and particularly the steps from block 50 to block 51. This part of the program deals with the ΣN/ΣD subroutine.

```
;** CALCULATION OF SIGMA SIGN(A)*B =SN AND SIGMA ABS(A)    =SD
;          A= V AT PREV.SAMPLING - V AT CURR.SAMPLING (SAME PHASE)
;          B= V AT CURR.SAMPLING - V AT N SAMPLING INST PAST(,,)
;
;**   ISIG    : NUMBER OF PHASES  (1 OR 3)
;**   AEBFC   : LOCATION IN 'DISP MEMORY' CURRENTLY BEING POINTED
;**   ADRAD   : ADRESS OF THE A/D (CONTAINING THE NEW 'V' SIGNAL)
;**   ASNT    : ADRESS WHERE THE SIGMA 'SIGN(A)*B = 'SN' IS STORED
;**   ASDT    : ADRESS WHERE THE SIGMA 'A'        = 'SD' IS STORED

CTE3:    3
COUNT:   0
RETFR:   0
SNSD:    STA    3,RETFR    ;SAVE RETURN ADDRESS IN RETFR
         LDA    0,ISIG     ;ISIG=3 FOR 3 PHASE
         STA    0,COUNT    ;COUNTER ICOUNT SET TO EQUAL ISIG
         LDA    3,ADRAD    ;AC3=ADDRESS OF A/D #1
         LDA    2,AEBFC    ;AC2=CURRENT ADR.POINTED IN DISP MEMORY
LFREQ:   LDA    1,0,3      ;AC1=V(I)
         LDA    0,-3,2     ;AC0=V(I-1)
         SUB    1,0        ;AC0=V(I-1)-V(I) = A
         MOVL   0,1        ;SAVE THE SIGN OF A IN THE CARRY BIT
         MOVL#  0,0,SZC    ;AC0 CONTENTS NEGATED IF NEGATIVE
         NEG    0,0        ;NOW AC0=ABS(A)
         LDA    1,@ASDT    ;AC1=SUM OF 'A' ALREADY ACCUMILATED
         ADD    0,1        ;AC1=OLD SUM + THE NEW A =SD
         STA    1,@ASDT    ;SAVE NEW SUM 'SD' IN PLACE OF OLD
         LDA    1,0,3      ;AC1=V(I)
         LDA    0,0,2      ;AC0=V(I-N) OLDEST VALUE IN DISP MEMORY
         STA    1,0,2      ;OLDEST 'V' REPLACED BY THE NEWEST 'V'
         MOVA   0,0,SZC    ;A.GE.0? BY TESTING CARRY BIT
         SUB    0,1,SKP    ;NO , AC1=B=V(I)-V(I-N)
         SUB    1,0,SKP    ;YES, AC0=B=V(I-N)-V(I)
         MOV    1,0        ;NOW AC0=SIGN(A)*B
         LDA    1,@ASNT    ;AC1=SUM OF 'B' ALREADY ACCUMILATED 'SN
         ADD    0,1        ;AC1=OLD SUM+NEW 'SIGN(A)*B' = SN
         STA    1,@ASNT    ;SAVE NEW SUM 'SN' IN PLACE OF OLD
         INC    2,2        ;DISP MEMORY POINTER ADVANCED BY ONE
         INC    3,3        ;NEXT A/D ADR. TO READ NEXT PHASE
         DSZ    COUNT      ;ANY PHASE REMAINING TO BE TREATED?
         JMP    LFREQ      ;IF YES THEN JUMP TO LFREQ
         LDA    2,AEBFC    ;
         LDA    0,CTE3     ;
         ADD    0,2        ;
         STA    2,AEBFC    ;DISP POINTER UPDATED(INCREM.BY 3)
         JMP    @RETFR     ;RETURN
;*************************************************************
;** CALCULATION OF SN/SD * 2**16
;** RESULT STORED IN IBUF(1,I)      I=1,NCYC                **
;*************************************************************
RETSA:   0
SAUV:    STA    3,RETSA    ;SAVE RETURN ADDRESS
```

```
        LDA      0,aASNA      ;AC0= SN
        SUBO     1,1          ;AC1=0
        LDA      2,aASDA      ;AC2= SD
        JSR      DIVS         ;SIGNED   AC1 = (AC0,AC1) / AC2
        STA      1,aAIBFC     ;IBUF(1,I)= SN/SD * 2**16
        ISZ      AIBFC        ;INCREMENT POINTER IN IBUF (OUTPUT BUF
        JMP      aRETSA       ;RETURN TO CALLING PROGRAM
        .END
        END
```

The following is a computer program listing to simulate the operation of the flow diagram of FIG. 3 and particularly the steps in the blocks 52 and 53. This part of the program simulates a frequency computation.

```
C ACQFR
; SOUS ROUTINE ACQFR, CALCUL DES FREQUENCES VERSION 2
; SEQUENCE D'APPEL EN FORTRAN:
;       CALL ACQFR(IPARA,IBUF,IER)
; AVEC:
; IPARA:   INTEGER IPARA(6)
;    (1) :ADRAD= ADR. DU 1ER CANAL DES A/D
;    (2) :ISIG = CODE TYPE DE RESEAU
;              1: MONO-PHASE
;              2: BI-PHASE
;              3: TRI-PHASE
;    (3) :NFE  = COMPTEUR DE FREQUENCE D'ECHANTILLONNAGE
;    (4) :NECH = NBRE. ECHAN./CYCLE
;    (5) :NCYC = NBRE. DE CYCLE A OBSERVER
; IBUF :   INTEGER IBUF(NCYC)    CONTAINS NFE FOR NCYC CYCLES
; IER  :FLAG D'ERREUR
;       =0, RETOUR NORMAL
;       =1, ERREUR INTERRUPT SPURRIOUS
;       =2, ERREUR MANQUE DE TEMPS DANS PART1
;       =3,  //     //    //   //   //  PART2
;       =4, ERREUR TEMPS D'ATTENDRE INTERRUPT EXPIRE
;       =5, ARRET DU PROGRAMME PAR CTRL I DU TTY
        .TITL    ACQFR
        .ENT     ACQFR
        .EXTD    CPYLS ,FRET
        .RDX     8
        .DIAC    PSHA=61401    ;PUSH A
        .DIAC    POPA=61601    ;POP A
        .DIAC    MTSP=61001    ;MOVE TO STACK POINTEUR
        .DIAC    MTFP=60001    ;MOVE TO FRAME POINTEUR
        .DIAC    MFSP=61201    ;MOVE FROM STACK POINTEUR
        .DIAC    MFFP=60201    ;MOVE FROM FRAME POINTEUR
        .DUSR.   SAV=62401     ;SAVE
        .DUSR    RET=62601     ;RETURN
        .ZREL
;ZONE ZERO DE LA MEMOIRE
        .LOC     0
MEMO:   .BLK     1             ;ADR. OU LE PROG. INTERROMPRE
MEM1:   .BLK     1             ;ADR SERVICE INTERRUPT ROUTINE
        .LOC     50
STACK:  .BLK     20            ;ZONE STACK
ADRAD:  .BLK     1             ;ADR A/D #1
ISIG:   .BLK     1             ;CODE TYPE DE RESEAU
NFE:    .BLK     1             ;COMPTEUR FREQ. ECHANT.
NECH:   .BLK     1             ;NBRE. ECHAN/CYCLE
NCYC:   .BLK     1             ;NBRE. DE CYCLE A OBSERVER
AIBUF:  .BLK     1             ;ADR. DE IBUF
AIEN:   .BLK     1             ;ADR. DE IER
NECHC:  .BLK     1             ;COMPTEUR NECH
ASDT:   .BLK     1             ;//   SD (S10) DE TRAVAIL
ASDA:   .BLK     1             ;//   //  //   ACCUMULE
ASNT:   .BLK     1             ;//   SN (S0)  DE TRAVAIL
ASNA:   .BLK     1             ;//   //  //   ACCUMULE
AERFC:  .BLK     1             ;ADR. DE ERF COURANT
AIBFC:  .BLK     1             ;ADR. DE IBUF ACTUEL
FLCSR:  .BLK     1             ;FLAG INDIQUE LE DEB. DE CHAQUE CYCL.
FLPT1:  .BLK     1             ;FLAG DE PART1
FLPT2:  .BLK     1             ;//   //  PART2
NAD:    .BLK     1             ;NBRE. DES A/D = 8
NCYCC:  .BLK     1             ;COMPTEUR DE NCYC
NFEE:   .BLK     1             ;NOUVEAU NFE
NFECH:  .BLK     1             ;=NFE/NECH
DNFE:   .BLK     1             ;LIMITE DE VARIATION DE NFEE
NINIT:  .BLK     1             ;NBR. DE CYCLES D'INITIALISATION
;FIN DE ZONE ZERO ************************************************
        .NREL
AZZFH:  .BLK     64            ;SAUVE DE ZONE ZERO
VECS1:  .BLK     2             ;VECTEUR S1 (02 MOTS) SN,SD
VECS2:  .BLK     2             ;   //     S2 (02  //  ) SN,SD
ERU:    .BLK     3             ;   //     ERU( 3  //  )
ERF:    .BLK     300           ;   //     ERF(192 //  )
;FIN DE ZONE DES VECTEURS INTERNES
N120 -  10                     ;COMPTEUR DELAI 2 SEC.
        3                      ;NBRE DES ARGUMENTS DE ACQFR
```

```
;DEBUT DU SOUS ROUTINE ACQPR
ACQ5H:  JSR     3,CRYLO         ;TRANSFERT DES ADR DES ARGUMENTS
        LDA     0,K12           ;DELAI 2 SEC TO PERMIT PENDING
        STA     0,COUN2         ;FORTRAN I/O OPERATIONS TO GET
        SUBO    0,0             ;COMPLETED.
        STA     0,COUN1
        DSZ     COUN1
        JMP     .-1
        DSZ     COUN2
        JMP     .-3
        INTDS                   ;DISABLE INTERRUPT
        STA     3,AC3SV         ;SAUVER AC3
        LDA     0,NMZZ          ;SAUVER ET CLEAR ZONE ZERO
        STA     0,COUN1
        LDA     2,ASTCK         ;AC2=ADR. STACK
        LDA     3,ASZER         ;AC3=ADR. SZZER
        SUBO    1,1             ;AC1=0
LOOP1:  LDA     0,0,2           ;AC0=CONTENU ZONE ZERO
        STA     0,0,3           ;SAUVER CONTENU
        STA     1,0,2           ;CLEAR ZONE ZERO
        INC     2,2
        INC     3,3
        DSZ     COUN1           ;FIN?
        JMP     LOOP1           ;NON
        LDA     0,NMVEC         ;OUI,CLEAR VECTEURS DE TRAVAIL
        STA     0,COUN1
LOOP2:  STA     1,0,3
        INC     3,3
        DSZ     COUN1
        JMP     LOOP2
        LDA     3,AC3SV
        LDA     0,-166,3        ;SAUVER ADR. IBUF
        STA     0,AIBUF
        STA     0,AIBFC
        LDA     0,-165,3        ;SAUVER ADR. IER
        STA     0,AIER
        STA     1,@AIER         ;CLEAR IER
        LDA     2,-167,3        ;SAUVER IPARA DANS ZONE ZERO
        LDA     3,AADAD
        LDA     0,NPARA
        STA     0,COUN1
LOOP4:  LDA     0,0,2
        STA     0,0,3
        INC     2,2
        INC     3,3
        DSZ     COUN1
        JMP     LOOP4
        LDA     0,C6            ;METTRE NAD=6.
        STA     0,NAD
        LDA     2,AVS1
        STA     2,ASNT          ;ASNT=AVS1
        INC     2,2
        STA     2,ASDT          ;ASDT=ASNT+1
        LDA     2,AVS2
        STA     2,ASNA          ;ASNA=AVS2
        INC     2,2
        STA     2,ASDA          ;ASDA=ASNA+1
        LDA     2,AEBF
        STA     2,AEBFC         ;AEBFC=ADR. EBF
        LDA     1,NECH
        STA     1,NECHC         ;NECHC=NECH
        SUBO    0,0
        STA     0,CWAIT         ;CWAIT=0
        LDA     2,NCYC
        STA     2,NCYCC         ;NCYCC=NCYC
        STA     2,COUN1         ;COUN1=NCYC
        LDA     2,AIBUF         ;CLEAR IBUF
LOOP6:  STA     0,0,2
        INC     2,2
        DSZ     COUN1
        LDA     1,NFE
        STA     1,NFEE          ;NFEE=NFE
        LDA     2,NECH
        DIV
        STA     1,NFECH         ;NFECH=NFE/NECH
        SUBO    0,0
        LDA     1,CNFE
        DIV
        STA     1,DNFE          ;DNFE=60./NECH (VAR. .05HZ/CYCLE)
        LDA     0,CNINI
        STA     0,NINIT         ;NINIT=CNINI
        LDA     0,MEMO
        STA     0,SMEMO         ;SAUVER MEMO
        LDA     0,MEM1
        STA     0,SMEM1         ;SAUVER MEM1
        LDA     0,ASVIM
        STA     0,MEM1          ;MEM1=ADR. ROUTINE SERVICE INTERRUPT
        MFSP    0               ;SAUVER STACK POINTEUR
        STA     0,SPSAV
        LDA     0,ASTCK
        MTSP    0               ;STACK POINTEUR=ADR. STACK
        MFFP    0
        STA     0,FPSAV         ;SAUVER FRAME POINTEUR
        LDA     0,MASK1
        MSKO    0               ;MASK LES INTER. SAUF GEN. PULSES
        LDA     0,NFEE          ;ACTIVER GEN. PULSES
        DOC     0,42
```

```
            OOCS       0,42
            INTEN                   ;ENABLE INTERRUPT
            JMP        WAITI        ;ATTENDRE INTERRUPT
COUN2:      0
COUN1:      0
AC3SV:      0                       ;SAUVE DE AC3
NMZZ:       52                      ;NBR. DE MOTS UTILISES ZONE ZERO
ASTCK:      STACK                   ;ADR. DE STACK

AZZER:      SZZER                   ;ADR. ZONE SAUVE DE ZONE ZERO
NMVEC:      143                     ;NBR. DE MOTS DES VECTEURS TRAVAIL
C6:         6                       ;CONSTANTE=6.
NPARA:      5                       ;NBR. DE MOTS DANS IPARA
AADAD:      ADRAD                   ;ADR. DE ADRAD
AVS1:       VECS1                   ;//    //  VECS1
AVS2:       VECS2                   ;//    //  VECS2
AEBF:       EBF                     ;//    //  EBF
SMEM0:      0                       ;SAUVE DE MEM0
SMEM1:      0                       ;SAUVE DE MEM1
ASVIN:      SVINI                   ;ADR. DE ROUTINE SERV. INT. INITIAL
SPSAV:      0                       ;SAUVE DE STACK POINTER
FPSAV:      0                       ;SAUVE DE FRAME POINTEUR
MASK1:      173777                  ;MASK INTERRUPTS SAUF. GEN. PULSES
MASK2:      177374                  ;MASK GEN. PULSES
CERIN:      4                       ;CTE ERR TEMPS D'ATTENDRE INTERRUPT
CWAIT:      0                       ;COMPTEUR ATTENDRE INTERRUPT
CNFE:       64.                     ;VARIATION IN NFE PERMITTED PER CYCLE
CNINI:      42.                     ;INITIAL WAITING PERIOD(CNINI CYCLES)
;**** ATTENDRE INTERRUPT DU GEN. DE PULSES ****
WAITI:      DSZ        CWAIT
            JMP        .-1
            LDA        0,CERIN      ;TEMPS D'ATTENDRE EXPIRE

;**** RETURN AU PROGRAMME FORTRAN
RETRN:      INTDS
            LDA        3,ASTCK      ;RECOPIER ZONE ZERO
            LDA        2,AZZER
            LDA        0,NMZZ
            STA        0,COUN1
LOOPS:      LDA        0,0,2
            STA        0,0,3
            INC        2,2
            INC        3,3
            DSZ        COUN1
            JMP        LOOPS
            LDA        0,SMEM0      ;RESTORE MEM0
            STA        0,MEM0
            LDA        0,SMEM1      ;RESTORE MEM1
            STA        0,MEM1
            LDA        0,SPSAV      ;RESTORE STACK POINTEUR
            MTSP       0
            LDA        0,FPSAV      ;RESTORE FRAME POINTEUR
            MTFP       0
            LDA        0,MASK2      ;RESTORE MASK INTERRUPTS
            MSKO       0
            NIOC       42
            LDA        3,AC3SV
            INTEN
            JSR        @.FRET
ERISP:      LDA        0,CERIS      ;ERREUR INTERRUPT SPURRIOUS
            JMP        RETRS
ERPT1:      LDA        0,CEPT1      ;ERREUR PART1
            JMP        RETRS
CERIS:      1
CEPT1:      2
;**** ROUTINE DE SERVICE INTERRUPT *****************
SVAC3:      0                       ;SAUVE AC3
SVINT:      SKPDZ      CPU          ;POWER FAIL?
            HALT                    ;OUI, HALT
            SKPDN      42           ;INTERRUPT GEN PULSES?
            JMP        ERISP        ;NON
            STA        3,SVAC3      ;SAUVER AC3
            LDA        3,MEM0       ;AC3=ADR. OU EST INTERROMPU
            SAV                     ;SAUVER AC0,AC1,AC2,FP,KRY+AC3
            LDA        0,SVAC3      ;SAUVER AC3 DANS LA PLACE DE FP
            STA        0,-1,3
            NIOS       42           ;START GENERATEUR DE PULSES
            INTEN
            SUBO       0,0
            STA        0,CWAIT      ;CLEAR CWAIT
;**** COMMENCER LES CALCULS DE PART1
            LDA        0,FLPT1      ;VERIFIER FLPT1
            MOV#       0,0,SZR
            JMP        ERPT1        ;FLPT1.NE.0, ERREUR
            SUBZL      0,0
            STA        0,FLPT1      ;FLPT1=0,CORRECT,METTRE LE=1
            JSR        @ASNSD       ;EXECUTE SUBROUTINE SN 3D CALCULATION
;************************************************************
;**FOLLOWING TO BE DONE AT THE LAST CYCLE ONLY              **
FINP1:      DSZ        NECHC        ;DECREMENT NECHC, 1 CYCLE TERMINE?
            JMP        RETP1        ;NON
            LDA        0,NECH       ;OUI,REINIT POUR PROCHAIN CYCLE
            STA        0,NECHC      ;NECHC=NECH
            LDA        0,ASNA       ;ECHANGER ASNA AVEC ASNT
            LDA        1,ASNT
            STA        0,ASNT
            STA        1,ASNA
```

```
                INC     0,0             ;ECHANGER ASDA AVEC ASDT
                STA     0,ASDT
                INC     1,1
                STA     1,ASDA
                LDA     3,AEBF1         ;METTRE EBU=3 DERNIERES LOC. DE EBF
                LDA     2,AEBFC
                LDA     0,-3,2
                STA     0,-3,3

LDA     0,-2,2
                STA     0,-2,3
                LDA     0,-1,2
                STA     0,-1,3
                STA     3,AEBFC         ;AEBFC=ADR EBF
                SUBO    0,0
                STA     0,ASNT          ;CLEAR SN ET SD
                STA     0,ASDT
                STA     0,FLCSH         ;CLEAR FLCSH
;VERIFIER PERIODE INITIALISATION TERMINE OU NON.
;CETTE PERIODE EST NECESSAIRE POUR QUE LE TAUX D'ECHANTILLONNAGE
;SOIT COMPLEMENT SYNCHRONISE.
                LDA     0,NINIT
                MOV#    0,0,SNR         ;NINIT=0?
                JMP     CLFP1           ;OUI
                DSZ     NINIT
                JMP     CLFP1
CLFP1:          SUBO    0,0             ;CLEAR FLPT1
                STA     0,FLPT1         ;CLEAR FLPT1
                JMP     PART2
RETP1:          SUBO    0,0
                STA     0,FLPT1         ;CLEAR FLPT1
                INTDS                   ;DISABLE INTERRUPT
                MFSP    0               ;AC0=STACK POINTEUR
                MTFP    0               ;FRAME POINTEUR=STACK POINTEUR
                INTEN                   ;ENABLE INTERRUPT
                RET                     ;RETURN
AEBF1:          EBF
ABNSD:          SNSD
;**** END OF CALCUL TO BE DONE EVERY SAMPLE ********************
;**** COMMENCER LES CALCULS DE PART2 ***************************
CEPT2:          3
ERPT2:          LDA     0,CEPT2         ;ERREUR PART2
                JMP     @ARETS
ARETS:          RETRS
;
NFES:           0
PART2:          LDA     0,FLPT2         ;VERIFIER FLPT2
                MOV#    0,0,SZR         ;FLPT2=0?
                JMP     ERPT2           ;NON, ERR. PART2
                SUBZL   1,1             ;OUI, METTRE FLPT2=1
                STA     1,FLPT2
                JSR     SAUV            ;CALL SUBR. TO SAVE DATA IN OUT.BUF
                DSZ     NCYCC
                JMP     VETTY
                INTDS                   ;FIN DE CALCUL, RETOUR PROG. FORTRAN
                JMP     @ARETN          ;NCYC=0, RETOUR PROG. FORTRAN
CTRLI:          11
;FIN DE PART2, SET FLPT2=0 ET RETOUR
RETP2:          SUBO    0,0             ;FIN DE PART2
                STA     0,FLPT2         ;CLEAR FLPT2
                INTDS
                MFSP    0
                MTFP    0               ;FRAME POINTEUR=STACK POINTEUR
                INTEN
                RET                     ;RETURN
;**** VERIFIER SI OPERATEUR DEMANDE D'ARRETER ******************
VETTY:          SKPDN   TTI
                JMP     RETP2           ;AUCUN MESSAGE, RETOUR PART2
                DIAS    0,TTI           ;LIRE MESSAGE
                LDA     1,MASKN
                AND     1,0
                LDA     1,CTRLI
                SUB#    0,1,SZR         ;CAR LU=CTRL I?
                JMP     RETP2           ;NON RETOUR PART2
                LDA     0,CSTRA         ;OUI ARRETER
                JMP     @ARESS
ARETN:          RETRN
CSTRA:          5
C3:             3
MASKN:          177
;**** ROUTINE DE SERVICE INTERRUPT, INIT. 1CYCLE EBF ****
SVINIT:         SKPOZ   CPU             ;POWER FAIL?
                HALT                    ;OUI HALT
                SKPDN   42              ;GEN. PULSE?
                JMP     @AERIS          ;NON,ERR. INT. SPURRIOUS
                NIOS    42              ;OUI,START 42
                INTEN
                SUBO    0,0
                STA     0,@ACWAT        ;CLEAR CWAIT
                LDA     3,ADRAD         ;AC3=ADR A/D #1
                LDA     2,AEBFC         ;AC2=ADR EBF ACTUEL
                LDA     0,ISIG
                NEG     0,0             ;AC0=-ISIG
LOPSV:          LDA     1,0,3           ;AC1=VP
                STA     1,0,2           ;EBF=VP
                INC     2,2
                INC     3,3
                INC     0,0,SZR         ;FIN?
                JMP     LOPSV           ;NON
```

```
         LDA      2,AEBFC       ;MIS A JOUR AEBFC
         LDA      0,C3
         ADD      0,2
         STA      2,AEBFC
         DSZ      NECHC         ;FIN DU 1ER CYCLE?
         JMP      @AWAIT        ;NON
         LDA      0,NECH
         STA      0,NECHC       ;NECHC=NECH
         LDA      0,ASVIN
         STA      0,MEM1        ;MEM1=ADR SERVICE INT.
         LDA      3,AEBF2       ;EBU=3 DERNIERES POS DE EBF
         LDA      2,AEBFC
         LDA      0,-3,2
         STA      0,-3,3
         LDA      0,-2,2
         STA      0,-2,3
         LDA      0,-1,2
         STA      0,-1,3
         STA      3,AEBFC
         JMP      @AWAIT
AWAIT:   WAITI
AERIS:   ERISP
ACHAT:   CHAIT
AEBF2:   EBF
ASVIN:   SVINT
; *************************************************************
; * DIVS: SIGNED DIVIDE SUBROUTINE     1/11/82                 *
; *       AC1 = ( AC0, AC1 ) / AC2     AC0 REMAINDER           *
; *       AC2 SHOULD BE POSITIVE. AC3 IS DESTROYED             *
; *************************************************************
DIVS:    MOVZ     0,0           ;CARRY INITIALIZED TO 0
         MOVZL#   0,0,SNC       ;SKIP IF (AC0,AC1) NEGATIVE
         JMP      .+1           ;POSITIVE
         NEGC     1,1,SNR       ;NEGATE (AC0,AC1) 32 BIT
         NEGC     0,0,SKP       ;
         COM      0,0           ;
         MOVL     3,3           ;STORE THE CARRY(SIGN OF AC0) IN AC3
         DIV                    ;AC1=(AC0,AC1)/AC2 UNSIGNED. AC0 REMAIN.
         MOV#     0,0,SNC       ;OVERFLOW?
         MOVL#    1,1,SZC       ;IS AC1 GT.2**15?
         ADCZR    1,1           ;IF EITHER TRUE THEN SET AC1= 32767
         MOVZR    3,3,SNC       ;RESET AC3 AND CARRY TO ORIGINAL VALUES.
         JMP      0,3           ;RETURN
         NEG      1,1           ;QUOTIENT AC1 NEGATED
         NEG      0,0           ;REMINDER NEGATED
         JMP      0,3           ;RETURN
```

The following is a computer Fortran language program listing to read in options and print the desired number of values.

```
C FREQP
C ************************************************************
C *   THIS PROGRAM READS THE FOLLWING OPTIONS INTERACTIVELY   *
C *       SAMPLING FREQUENCY IN HZ.    :FRE =    (1/DELTA)    *
C *       NUMBER OF SAMPLES IN AN AVERAGING PERIOD    (N)     *
C *       NUMBER OF FREQUENCY MEASUREMNTS TO BE PRINTED (NPR) *
C *   THEN IT ACTIVATES THE ASSEMBLER LANGUAGE PROGRAM WITH THE*
C *       PROPER OPTIONS, CHECKS FOR ERRORS AND OUTPUTS RESULTS*
C ************************************************************
C IB:     INTEGER IB(5)
C   1     : INTEGER NOHADDRESSE DU 1ER CANAL A CONVERTIR
C   2     : INTEGER ISIG:NBR. DE SIGNAUX A CONVERTIR
C   3     : INTEGER NFE:COMPTEUR DE FREQUENCE ECHANTILLONNAGE
C                    =(FREQ. CLOCK/FREQ. ECHANT.)-1.
C   4     :N= NBR. ECHAN./POINT DE CALCUL
C   5     :NPR= NBR. DE POINTS A ACCUMULER POUR LE TRAITMENT
C FCLK: FREQ. CLOCK= 5*10**6 HZ
        DIMENSION FREQ(1000)
        INTEGER IB(5),IBUF(1000)
        COMMON IB
        EQUIVALENCE (IB(1),NDRAD),(IB(2),IPH),(IB(3),NFE),(IB(4),N)
       *,(IB(5),NPR)
        TYPE ' FREQUENCY OF SUPPLY VOLTAGE'
        NDRAD=76000K
        FCLK=5000000.
        FIB=65536.0
        IPH=5
        NFE=FCLK/960.0-2.5
        N=16
        NPR=100
        FRE=FCLK/(NFE+3)
        WRITE(10,7010)FRE
7010    FORMAT(' SAMPLING RATE IN HZ(',F8.0,')(F8.0):',Z)
        READ(11,7403)FRE
7403    FORMAT(F8.0)
        IF(FRE.GT.0.)NFE=FCLK/FRE-2.5
        WRITE(10,7215)N
7215    FORMAT(1X,'NBR. OF SAMPLES TO BE AVERAGED (',I2,')?(I2)I:',Z)
7214    FORMAT(I2)
        READ(11,7214)J
        IF(J.GT.0)N=J
```

```
      WRITE(10,7203)NPN
      READ(11,7204)J
7203  FORMAT(1X,'NR. OF POINTS TO BE OUTPUT   (',I4,')?(I4)?')
7204  FORMAT(I4)
      IF(J.GT.0)NPN=J
      WRITE(10,7315)(IN(I),I=1,5)
7315  FORMAT(1X,5I10)
      CALL ACUFR(IS,IBUF,IER)
      IF(IER.EQ.0)GO TO 100
      GO TO(20,30,40,50,60)IER
  20  STOP ER1IS
  30  STOP ERPT1
  40  STOP ERPT2
  50  STOP ERAL
  60  STOP CTRL1
 100  CONTINUE
      WRITE(10,7315)(INPF(I),I=1,NPN)
      DO 1 I=1,NPN
    1 FREQ(I)=FLOAT(IN(F(I)))/110
```

```
01/20/82   12:56:39   TASK # 0800000C           SYSTEM PP3=32

1 FREQ(I)=RS/(S-DEL*N)
      WRITE(10,7601)(I,FREW(I),I=1,NPR)
7601  FORMAT(5(1X,'CYCLE FREW')/(5(2X,I4,F8.4)))
      STOP FRE.
      END
```

FREQUENCY OF SUPPLY
SAMPLING RATE IN HZ
NR. OF SAMPLES TO
NR. OF POINTS TO BE O
31744
CYCLE FREQ  CYCLE FREQ  CYCLE FREQ  CYCLE FREQ  CYCLE FREQ
 1 60.4019   2 60.3967   3 60.3933   4 60.3908   5 60.388
 6 60.3947   7 60.3935   8 60.4068   9 60.4053  10 60.402
11 60.3973  12 60.3949  13 60.3901  14 60.3899  15 60.385
16 60.3918  17 60.4008  18 60.4057  19 60.4018  20 60.399
21 60.3988  22 60.3938  23 60.3898  24 60.3885  25 60.394
26 60.4023  27 60.4066  28 60.4034  29 60.3997  30 60.398
31 60.3945  32 60.3898  33 60.3909  34 60.3869  35 60.3960
36 60.4062  37 60.4053  38 60.4018  39 60.3981  40 60.394
41 60.3920  42 60.3981  43 60.3872  44 60.3827  45 60.407
46 60.4062  47 60.4029  48 60.3996  49 60.3949  50 60.395
51 60.3905  52 60.3875  53 60.3832  54 60.3952  55 60.407
56 60.4044  57 60.3999  58 60.3973  59 60.3944  60 60.391
61 60.3887  62 60.3864  63 60.3824  64 60.4078  65 60.405
66 60.4023  67 60.3981  68 60.3931  69 60.3934  70 60.3901
71 60.3969  72 60.3838  73 60.3945  74 60.4066  75 60.403
76 60.4008  77 60.3977  78 60.3931  79 60.3905  80 60.388
81 60.3857  82 60.4031  83 60.4081  84 60.4058  85 60.4003
86 60.4003  87 60.3931  88 60.3928  89 60.3899  90 60.3872
91 60.3838  92 60.4068  93 60.4068  94 60.4028  95 60.3994
96 60.3977  97 60.3906  98 60.3912  99 60.3898 100 60.3853
STOP FREQ

FREQP
FREQUENCY OF SUPPLY VOLTAGE
SAMPLING RATE IN HZ ( 960.)(F8.0):3848.0
NR. OF SAMPLES TO BE AVERAGED (16)?(I4):64
NR. OF POINTS TO BE OUTPUT  ( 100)?(I4):10
31744
CYCLE FREQ  CYCLE FREQ  CYCLE FREQ  CYCLE FREQ  CYCLE FREQ
 1 60.3997   2 60.3996   3 60.3998   4 60.3990   5 60.399
 6 60.4001   7 60.3998   8 60.3998   9 60.3998  10 60.400
11 60.3993  12 60.3994  13 60.3994  14 60.4008  15 60.399
16 60.3990  17 60.3997  18 60.4008  19 60.4008  20 60.399
21 60.3997  22 60.3997  23 60.4001  24 60.3994  25 60.399
26 60.3999  27 60.3997  28 60.4008  29 60.3998  30 60.4000
31 60.3998  32 60.3998  33 60.3998  34 60.3998  35 60.399
36 60.3998  37 60.3988  38 60.4008  39 60.3995  40 60.3998
41 60.3992  42 60.3994  43 60.3997  44 60.3994  45 60.3998
46 60.3997  47 60.3997  48 60.3998  49 60.4003  50 60.398
51 60.3999  52 60.4004  53 60.3998  54 60.4002  55 60.3998
56 60.4003  57 60.4008  58 60.3996  59 60.3999  60 60.3998
61 60.4004  62 60.3998  63 60.4008  64 60.3993  65 60.399
66 60.3998  67 60.3998  68 60.4007  69 60.4007  70 60.4008
71 60.3997  72 60.3998  73 60.4006  74 60.3998  75 60.3998
76 60.3998  77 60.3998  78 60.4007  79 60.3998  80 60.4008
81 60.3998  82 60.4006  83 60.3994  84 60.3998  85 60.4008
86 60.3998  87 60.4005  88 60.3998  89 60.4008  90 60.398
91 60.3998  92 60.3994  93 60.4008  94 60.3997  95 60.3998
96 60.3998  97 60.3998  98 60.4008  99 60.3997 100 60.3998
STOP FREQ

```
FREQP
FREQUENCY OF SUPPLY VOLTAGE
SAMPLING RATE IN HZ(    960.)(F8.0):1920.
NBR. OF SAMPLES TO BE AVERAGED (16)?(I2):32
NBR.DE POINTS TO BE OUTPUT    ( 100)?(I4): 100
    31744         3      2601        32         100
   CYCLE FREQ   CYCLE FREQ   CYCLE FREQ   CYCLE FREQ   CYCLE FREQ
    1 60.4001    2 60.3970    3 60.3969    4 60.4021    5 60.4000
    6 60.3987    7 60.3970    8 60.4000    9 60.4015   10 60.3973
   11 60.3981   12 60.3974   13 60.4005   14 60.4011   15 60.3994
   16 60.3966   17 60.3982   18 60.4026   19 60.4006   20 60.3965
   21 60.3970   22 60.3996   23 60.4013   24 60.4005   25 60.3984
   26 60.3965   27 60.3991   28 60.4017   29 60.3991   30 60.3979
   31 60.3973   32 60.4012   33 60.4018   34 60.3978   35 60.3990
   36 60.3979   37 60.4029   38 60.3996   39 60.3984   40 60.3973
   41 60.3999   42 60.4003   43 60.3997   44 60.3979   45 60.3973
   46 60.4001   47 60.4011   48 60.3986   49 60.3973   50 60.3971
   51 60.4009   52 60.4016   53 60.3976   54 60.3976   55 60.3998
   56 60.4006   57 60.3997   58 60.3970   59 60.3975   60 60.3990
   61 60.4014   62 60.3981   63 60.3983   64 60.3962   65 60.4017
   66 60.3999   67 60.3987   68 60.3969   69 60.3979   70 60.4014
   71 60.4004   72 60.3973   73 60.3975   74 60.3970   75 60.4024
   76 60.3993   77 60.3982   78 60.3949   79 60.4002   80 60.4002
   81 60.3994   82 60.3973   83 60.3993   84 60.4012   85 60.4009
   86 60.3994   87 60.3971   88 60.4016   89 60.4017   90 60.3994
   91 60.3978   92 60.3966   93 60.4018   94 60.4008   95 60.3993
   96 60.3969   97 60.3980   98 60.4003   99 60.4017  100 60.3973
STOP FREQ
R

FREQP
FREQUENCY OF SUPPLY VOLTAGE
SAMPLING RATE IN HZ(    960.)(F8.0):480.0
NBR. OF SAMPLES TO BE AVERAGED (16)?(I2): 8
NBR.DE POINTS TO BE OUTPUT    ( 100)?(I4): 100
    31744         3     10414         8         100
   CYCLE FREQ   CYCLE FREQ   CYCLE FREQ   CYCLE FREQ   CYCLE FREQ
    1 60.4159    2 60.4072    3 60.4000    4 60.3934    5 60.3902
    6 60.3760    7 60.3743    8 60.3793    9 60.3621   10 60.3548
   11 60.3475   12 60.3405   13 60.3348   14 60.3245   15 60.4451
   16 60.4406   17 60.4339   18 60.4220   19 60.4173   20 60.4124
   21 60.4039   22 60.3969   23 60.3914   24 60.3833   25 60.3772
   26 60.3724   27 60.3656   28 60.3586   29 60.3502   30 60.3435
   31 60.3395   32 60.3282   33 60.4193   34 60.4436   35 60.4353
   36 60.4277   37 60.4239   38 60.4143   39 60.4073   40 60.4015
   41 60.3955   42 60.3890   43 60.3780   44 60.3761   45 60.3670
   46 60.3625   47 60.3565   48 60.3494   49 60.3409   50 60.3343
   51 60.3595   52 60.4477   53 60.4388   54 60.4321   55 60.4232
   56 60.4204   57 60.4100   58 60.4043   59 60.3987   60 60.3903
   61 60.3839   62 60.3772   63 60.3710   64 60.3636   65 60.3573
   66 60.3506   67 60.3475   68 60.3360   69 60.3312   70 60.3278
   71 60.4429   72 60.4324   73 60.4278   74 60.4220   75 60.4122
   76 60.4065   77 60.4018   78 60.3954   79 60.3943   80 60.3783
   81 60.3770   82 60.3679   83 60.3642   84 60.3515   85 60.3491
   86 60.3399   87 60.3342   88 60.3266   89 60.4458   90 60.4397
   91 60.4304   92 60.4233   93 60.4161   94 60.4116   95 60.4081
   96 60.3969   97 60.3927   98 60.3819   99 60.3803  100 60.3607
STOP FREQ
R

FREQP
FREQUENCY OF SUPPLY VOLTAGE
SAMPLING RATE IN HZ(    960.)(F8.0):3840.0
NBR. OF SAMPLES TO BE AVERAGED (16)?(I2):64
NBR.DE POINTS TO BE OUTPUT    ( 100)?(I4): 100
    31744         3      1299        64         100
   CYCLE FREQ   CYCLE FREQ   CYCLE FREQ   CYCLE FREQ   CYCLE FREQ
    1 59.6021    2 59.6019    3 59.6034    4 59.6017    5 59.6033
    6 59.6017    7 59.6035    8 59.6025    9 59.6013   10 59.6016
   11 59.6029   12 59.6018   13 59.6022   14 59.6019   15 59.6029
   16 59.6015   17 59.6017   18 59.6019   19 59.6014   20 59.6004
   21 59.6018   22 59.6033   23 59.6007   24 59.6024   25 59.6023
   26 59.6011   27 59.6036   28 59.6019   29 59.6030   30 59.6008
   31 59.6029   32 59.6017   33 59.6022   34 59.6024   35 59.6024
   36 59.6031   37 59.6007   38 59.6024   39 59.6020   40 59.6023
   41 59.6017   42 59.6030   43 59.6025   44 59.6022   45 59.6017
   46 59.6029   47 59.6019   48 59.6028   49 59.6024   50 59.6023
   51 59.6028   52 59.6010   53 59.6025   54 59.6026   55 59.6034
   56 59.6011   57 59.6019   58 59.6023   59 59.6025   60 59.6024
   61 59.6027   62 59.6028   63 59.6024   64 59.6022   65 59.6019
   66 59.6026   67 59.6017   68 59.6029   69 59.6036   70 59.6022
   71 59.6037   72 59.6015   73 59.6026   74 59.6030   75 59.6024
   76 59.6031   77 59.6019   78 59.6030   79 59.6026   80 59.6023
   81 59.6022   82 59.6031   83 59.6027   84 59.6017   85 59.6030
   86 59.6022   87 59.6007   88 59.6028   89 59.6014   90 59.6026
   91 59.6023   92 59.6025   93 59.6020   94 59.6010   95 59.6025
   96 59.6021   97 59.6028   98 59.6024   99 59.6013  100 59.6024
STOP FREQ
R
```

```
FREQP
FREQUENCY OF SUPPLY VOLTAGE
SAMPLING RATE IN HZ(    960.)(F8.0):1920.
NBR. OF SAMPLES TO BE AVERAGED (16)?(I2):32
NBR.DE POINTS TO BE OUTPUT    ( 100)?(I4): 100
    31744       3    2601       32       100
   CYCLE FREQ   CYCLE FREQ   CYCLE FREQ   CYCLE FREQ   CYCLE FREQ
    1 59.6055   2 59.6026    3 59.6033    4 59.6023    5 59.6052
    6 59.6056   7 59.6035    8 59.5996    9 59.6053   10 59.6056
   11 59.6045  12 59.6016   13 59.6016   14 59.6064   15 59.6057
   16 59.6039  17 59.6018   18 59.6039   19 59.6057   20 59.6051
   21 59.6033  22 59.5999   23 59.6066   24 59.6047   25 59.6059
   26 59.6019  27 59.6019   28 59.6076   29 59.6056   30 59.6033
   31 59.6013  32 59.6047   33 59.6066   34 59.6052   35 59.6023
   36 59.6013  37 59.6060   38 59.6053   39 59.6054   40 59.6011
   41 59.6004  42 59.6053   43 59.6068   44 59.6031   45 59.6017
   46 59.5988  47 59.6067   48 59.6049   49 59.6036   50 59.6011
   51 59.6018  52 59.6059   53 59.6044   54 59.6026   55 59.5999
   56 59.6036  57 59.6049   58 59.6045   59 59.6029   60 59.5991
   61 59.6078  62 59.6039   63 59.6050   64 59.5996   65 59.6014
   66 59.6073  67 59.6055   68 59.6020   69 59.6001   70 59.6041
   71 59.6050  72 59.6046   73 59.6024   74 59.6000   75 59.6062
   76 59.6054  77 59.6038   78 59.6023   79 59.5992   80 59.6065
   81 59.6050  82 59.6038   83 59.6083   84 59.6038   85 59.6066
   86 59.6045  87 59.6025   88 59.6008   89 59.6070   90 59.6054
   91 59.6049  92 59.6015   93 59.6008   94 59.6054   95 59.6061
   96 59.6051  97 59.6008   98 59.6049   99 59.6057  100 59.6064
STOP FREQ

FREQP
FREQUENCY OF SUPPLY VOLTAGE
SAMPLING RATE IN HZ(    960.)(F8.0):960.
NBR. OF SAMPLES TO BE AVERAGED (16)?(I2):16
NBR.DE POINTS TO BE OUTPUT    ( 100)?(I4): 100
    31744       3    5205       16       100
   CYCLE FREQ   CYCLE FREQ   CYCLE FREQ   CYCLE FREQ   CYCLE FREQ
    1 59.6077   2 59.6215    3 59.6174    4 59.6151    5 59.6096
    6 59.6080   7 59.6020    8 59.6009    9 59.5945   10 59.6009
   11 59.6234  12 59.6200   13 59.6141   14 59.6115   15 59.6098
   16 59.6053  17 59.6019   18 59.5971   19 59.5922   20 59.6238
   21 59.6191  22 59.6174   23 59.6148   24 59.6092   25 59.6069
   26 59.6035  27 59.5974   28 59.5953   29 59.6089   30 59.6231
   31 59.6163  32 59.6159   33 59.6106   34 59.6086   35 59.6034
   36 59.5999  37 59.5985   38 59.5916   39 59.6146   40 59.6200
   41 59.6150  42 59.6137   43 59.6077   44 59.6067   45 59.5990
   46 59.5990  47 59.5942   48 59.6094   49 59.6215   50 59.6166
   51 59.6134  52 59.6104   53 59.6099   54 59.6037   55 59.5973
   56 59.5963  57 59.5915   58 59.6249   59 59.6185   60 59.6159
   61 59.6114  62 59.6091   63 59.6036   64 59.6017   65 59.5966
   66 59.5939  67 59.6169   68 59.6217   69 59.6159   70 59.6133
   71 59.6104  72 59.6071   73 59.6019   74 59.5984   75 59.5961
   76 59.6083  77 59.6239   78 59.6174   79 59.6154   80 59.6127
   81 59.6054  82 59.6066   83 59.6012   84 59.5954   85 59.5932
   86 59.6226  87 59.6222   88 59.6167   89 59.6122   90 59.6099
   91 59.6051  92 59.6033   93 59.5981   94 59.5953   95 59.6065
   96 59.6220  97 59.6193   98 59.6139   99 59.6097  100 59.6092
STOP FREQ
R

FREQP
FREQUENCY OF SUPPLY VOLTAGE
SAMPLING RATE IN HZ(    960.)(F8.0):480.
NBR. OF SAMPLES TO BE AVERAGED (16)?(I2): 8
NBR.DE POINTS TO BE OUTPUT    ( 100)?(I4): 100
    31744       3   10414        8       100
   CYCLE FREQ   CYCLE FREQ   CYCLE FREQ   CYCLE FREQ   CYCLE FREQ
    1 59.5957   2 59.5763    3 59.5695    4 59.6349    5 59.6062
    6 59.6901   7 59.6758    8 59.6662    9 59.6609   10 59.6530
   11 59.6441  12 59.6416   13 59.6335   14 59.6283   15 59.6188
   16 59.6129  17 59.6090   18 59.6003   19 59.5941   20 59.5849
   21 59.5796  22 59.5726   23 59.6297   24 59.6893   25 59.6833
   26 59.6741  27 59.6695   28 59.6602   29 59.6553   30 59.6471
   31 59.6411  32 59.6358   33 59.6293   34 59.6202   35 59.6144
   36 59.6099  37 59.6012   38 59.5932   39 59.5970   40 59.5800
   41 59.5742  42 59.6320   43 59.6895   44 59.6940   45 59.6744
   46 59.6677  47 59.6612   48 59.6538   49 59.6509   50 59.6399
   51 59.6352  52 59.6315   53 59.6204   54 59.6140   55 59.6089
   56 59.6017  57 59.5949   58 59.5974   59 59.5784   60 59.5747
   61 59.5659  62 59.6910   63 59.6844   64 59.6746   65 59.6700
   66 59.6601  67 59.6538   68 59.6497   69 59.6404   70 59.6339
   71 59.6322  72 59.6229   73 59.6139   74 59.6101   75 59.5994
   76 59.5956  77 59.5980   78 59.5904   79 59.5724   80 59.5666
   81 59.6930  82 59.6835   83 59.6779   84 59.6684   85 59.6687
   86 59.6551  87 59.6483   88 59.6425   89 59.6360   90 59.6336
   91 59.6212  92 59.6148   93 59.6004   94 59.6027   95 59.5974
   96 59.5995  97 59.5790   98 59.5736   99 59.6003  100 59.6941
STOP FREQ
```

We claim:

1. A method of measuring frequency or frequency deviation or time period deviation of a low frequency signal in the range of approximately from 0 to 2 KHz, said method comprising the steps of:
   (i) sampling said periodic signal at precise time intervals to obtain sampled values,
   (ii) converting said sampled values to provide digital value signals,
   (iii) storing a predetermined number of said digital value signals representative of at least one time period of said periodic signal, and
   (iv) deriving said frequency or frequency deviation or time period deviation by linearly interpolating two successive samples of said digital value signals to determine the time period deviation of said periodic signal and in accordance with the formula $$N = (V_{i-n} - V_i)\text{Sgn}(V_{i-1} - V_i)$$

$$D = |V_{i-1} - V_i| + |V_{i-n+1} - V_{i-n}|$$

$$\tfrac{1}{2}\alpha = \Sigma N / \Sigma D$$

$$f = 1/(n-\alpha)\delta$$

where $V_i$, $V_{i-1}$, $V_{i-n}$ and $V_{i-n+1}$ are digital value signals and Sgn is the sign + or −, $\alpha$ the time period deviation and f the frequency $V_{i-1}$ and $V_{i-n+1}$ are to be replaced by $V_{i-3}$ and $V_{i-n+3}$ in case of a three-phase multiplexed signal.

2. A method as claimed in claim 1 wherein said step of linearly interpolating comprises (a) feeding a first signal ($V_i$) and a second signal ($V_{i-1}$) of said stored digital value signals to a first differential operator, (b) feeding a last signal ($V_{i-n}$) and a second to last signal ($V_{i-n+1}$) of said stored digital value signals to a second differential operator, (c) effecting a predetermined controlled function in said differential operators to provide output information signals, (d) providing absolute value signals of said information signals, accumulating said absolute value signals representative of signal values D, (f) feeding said first and last stored digital value signals to a third differential operator to provide further output information signals, accumulating said further output information signals representative of signal values N.

3. A method as claimed in claim 1 wherein said periodic signal is a three-phase periodic signal and wherein there is further provided the step of sequentially selecting each signal of said three phases for sampling at each said precise time intervals.

4. A measuring system for measuring power system frequencies in the low frequency range of approximately 0 to 2 KHz, said system comprising an analog to digital converter circuit having an input for receiving a signal to be measured, a real time clock connected to said converter circuit to provide periodic impulses for sampling said periodic signal at precise intervals, said converter circuit providing output digital value signals at said precise intervals and derived from a periodic signal at its input, memory device for storing a predetermined number of said digital values representative of the lapse time of at least a time period of said periodic signal, and operator system means for processing selected samples of said stored digital values to provide output numerator and denominator values expressed by the formula:

$$N = (V_{i-n} - V_i)\text{Sgn}(V_{i-1} - V_i)$$

$$D = |V_{i-1} - V_i| + |V_{i-n+1} - V_{i-n}|,$$

wherein $V_i$, $V_{i-1}$, $V_{i-n}$ and $V_{i-n+1}$ are digital values and Sgn is the sign + or −, and divider to provide a resultant output from said N and D values, said resultant value being representative of the time period deviation, frequency deviation or frequency of said input periodic signal.

5. A measuring system as claimed in claim 4 wherein said operator system means comprises differential operators connected to associated ones of said selected ones of said digital value signals, a first and second of said differential operators each have an output connected to an associated one of two absolute operator circuits, each operator circuit having an output connected to a first accumulator to feed absolute value signals thereto, said first accumulator accumulating instantaneous signals representative of said denominator signal values "D", a third differential operator receives a first and last of said selected ones of said digital value signals and a sign signal "Sgn" of said absolute operator, circuit associated with said first differential operator and a second accumulator operator circuit connected to an output of said third differential operator for accumulating instantaneous signals representative of said numerator signal values "N".

6. A measuring system as claimed in claim 5 wherein said first differential operator is provided with two inputs connected respectively to a first ($V_i$) and second ($V_{i-1}$) digital value signal of said selected ones, said second differential operator also being provided with two inputs connected respectively to a last ($V_{i-n}$) and a second to last ($V_{i-n+1}$) digital value signal of said selected ones, said third differential operator having two inputs connected respectively to said first and last digital value signal.

7. A measuring system as claimed in claim 6 wherein each said differential operators have a control input to determine the sign of its function, said first and second differential operators having a fixed control input, said third differential operator having a control input dependent on said sign signal "Sgn" at the output of said absolute operator associated with said first differential operator.

8. A measuring system as claimed in claim 5 wherein said frequency signal is a single phase periodic signal, said divider means being a divider circuit connected to said accumulator operators to divide said output numerator signal N by said output denominator signal D.

9. A measuring system as claimed in claim 5 wherein said signal is a three-phase periodic signal, and wherein there is further comprised a multiplex circuit for sequentially selecting one signal of said three phases at each said precise intervals for sampling of its value by said converter circuit to provide output digital value signals from said three phases.

10. A measuring device as claimed in claim 5 wherein said operators are realized by microprocessor based systems.

* * * * *